(12) United States Patent
Kobayashi et al.

(10) Patent No.: US 6,803,781 B2
(45) Date of Patent: Oct. 12, 2004

(54) RESOLVER, RESOLVER FAULT DETECTION CIRCUIT, AND RESOLVER FAULT DETECTION METHOD

(75) Inventors: Masahiro Kobayashi, Ota-ku (JP); Taiichi Miya, Ota-ku (JP)

(73) Assignee: Minebea Co., Ltd., Kitasaku-Gun (JP)

( * ) Notice: Subject to any disclaimer, the term of this patent is extended or adjusted under 35 U.S.C. 154(b) by 0 days.

(21) Appl. No.: 09/862,597

(22) Filed: May 23, 2001

(65) Prior Publication Data

US 2001/0054911 A1 Dec. 27, 2001

(30) Foreign Application Priority Data

Jun. 9, 2000 (JP) ........................................ 2000-173690

(51) Int. Cl.[7] .......................... G01R 31/34; G05B 1/06
(52) U.S. Cl. ....................... 324/772; 318/661; 310/68 B
(58) Field of Search .......................... 324/158.1, 207.25, 324/772; 318/661, 605, 656, 657; 340/635, 648; 310/68 B

(56) References Cited

U.S. PATENT DOCUMENTS 3,593,337 A * 7/1971 Ellison .................. 340/870.34
4,342,952 A * 8/1982 Bowie .......................... 318/654
4,659,973 A * 4/1987 Stich ............................ 318/718
5,051,847 A * 9/1991 Philipps ........................ 360/46

FOREIGN PATENT DOCUMENTS

JP      A 4-307375      10/1992
JP      A 8-289521      11/1996

* cited by examiner

*Primary Examiner*—Evan Pert
*Assistant Examiner*—Russell M. Kobert
(74) *Attorney, Agent, or Firm*—Oliff & Berridge, PLC

(57) ABSTRACT

An output terminal is provided at the middle point of each of output windings 112X and 112Y of a resolver 10. A difference between a voltage V2X (V2Y), between one of the end terminals and the middle point of the output winding, and a voltage V1X (V1Y), between the other end terminal and the middle point of the output winding, is detected by a difference voltage detection circuit 101, and supplied to a logical summing circuit 126 via a rectifier circuit 124 and a comparator circuit 125. In accordance with an output from the logical summing circuit 126, a fault of the windings, such as short-circuiting or the like, can be detected even at a specific rotation angle of the rotor. Thus, a resolver in which a fault thereof can be easily detected, as well as a resolver fault detection circuit, can be provided.

5 Claims, 13 Drawing Sheets

OUTPUT WINDING
112X

DIFFERENCE VOLTAGE DETECTION TRANSFORMER 30

Fig. 11

|  | VER OUTPUT VOLTAGE (V) | | | |
|---|---|---|---|---|
| Angle (degree) | Normal | 7-8 Short | 7-9 Short | 7-S-Short |
| 0 | 0.32 | 0.84 | 1.04 | 1.04 |
| 20 | 0.32 | 1.04 | 1.12 | 1.28 |
| 25 | 0.32 | 1.12 | 1.25 | 1.36 |
| 45 | 0.32 | 1.16 | 1.32 | 1.4 |
| 65 | 0.32 | 0.92 | 1.08 | 1.08 |
| 70 | 0.32 | 0.92 | 0.96 | 1.12 |
| 90 | 0.32 | 0.8 | 1 | 1.04 |

Fig. 12

|  | VER OUTPUT VOLTAGE (V) | | | |
|---|---|---|---|---|
| Angle (degree) | Normal | 1-2 Short | 1-3 Short | 1-R-Short |
| 0 | 0.32 | 0.8 | 1.16 | 1.32 |
| 20 | 0.32 | 0.72 | 1 | 1.2 |
| 25 | 0.32 | 0.68 | 1 | 1.2 |
| 45 | 0.32 | 1 | 1.32 | 1.52 |
| 65 | 0.32 | 1.24 | 1.56 | 1.84 |
| 70 | 0.32 | 0.8 | 1.56 | 1.72 |
| 90 | 0.32 | 0.76 | 1.08 | 1.28 |

DIFFERENCE OF ROTOR-ANGLE

TRANSMITTER RESOLVER          RECEIVER RESOLVER

RESOLVER, RESOLVER FAULT DETECTION CIRCUIT, AND RESOLVER FAULT DETECTION METHOD

BACKGROUND OF THE INVENTION

1. Field of the Invention

The present invention relates to a resolver, and more particularly, a resolver having a structure in which a fault can be rapidly detected even when windings are short-circuited. Furthermore, the present invention relates to a method for detecting a fault by means of provision of a fault detection circuit for detecting such an accident.

2. Description of the Related Art

A resolver is one kind of synchronous transmitter which provides from its output windings an output signal that has an amplitude modulated in accordance with X and Y components of a rotation angle of its rotor. Conventionally, the resolver is typically used as a detection system or for triangulation calculation in a servomechanism.

For example, a resolver as shown in FIG. 14 includes a rotor, a stator and two pairs of orthogonal windings, i.e., excitation windings 111 and output windings 112. Two of such resolvers make a pair, in which the stators or rotors of the respective resolvers are coupled to each other. One phase of either the stator or the rotor of the resolver functioning as a transmitter is excited by AC power. Thus, an AC output in accordance with a difference between a rotation position of the transmitter resolver and that of the receiver resolver can be obtained at the corresponding orthogonal phase of the transmitter resolver.

An alternative structure of the resolver is known as a variable reluctance resolver. In this structure, a rotor has a shape of a rectangle or the like and no winding is provided around the rotor. A stator is provided with a plurality of poles with an excitation winding and an output winding being wound around the same pole of the stator. A sum of outputs from the plurality of output windings at the different poles is provided as a single output from the output windings.

FIG. 16 shows an example of the winding structure of the above-mentioned resolver. The relationship between the excitation winding 111 and the output winding 112 to be wound around any one of the poles is defined as follows. The respective excitation windings 111 are wound around the poles so that an N pole and an S pole of the resultant magnetization appear alternatively at the adjacent poles, while the respective output windings 112 are wound around the poles so that an N pole and an S pole of the resultant magnetization appear alternatively at every two poles. More specifically, when the excitation winding 111 at the first pole provides an N pole, N poles are generated by the output windings 112 at the first and second poles, while S poles are generated by the output windings 112 at the third and fourth poles, and such a configuration will appear in the repeated manner.

In the resolver having the above-mentioned construction, a fault such as short-circuit between the windings may occur. Thus, fault detection is necessary for improving the reliability of an apparatus incorporating therein a resolver.

FIG. 15 shows an example of a conventional resolver and a fault detection circuit utilizing the same. The configuration in FIG. 15 includes a resolver 10 and a resolver fault detection circuit 11. The resolver 10 has output windings 112X and 112Y for respectively outputting an X direction component and a Y direction component of a rotor of a resolver 10. The resolver fault detection circuit 11 includes square calculators 121X and 121Y respectively connected to the output windings 112X and 112Y, an adder 123 for calculating a sum of outputs from both of the square calculators 121X and 121Y, a rectifier circuit 124 for rectifying an output VE from the adder 123, and a comparator circuit 125 for comparing an output from the rectifier circuit 124 with a reference voltage.

In order to facilitate understandings of the invention, the variable reluctance resolver is taken as an example which has a structure in which a stator is provided with a plurality of poles. The same pole of the stator is provided with an excitation winding 111, an output winding 112X for outputting an X direction component of a rotor, and an output winding 112Y for outputting a Y direction component of the rotor, that are wound therearound. A sum of outputs of the output windings wound around the respective poles is provided as a single output from the output windings. With respect to such a variable reluctance resolver, the relationship of phases among the excitation winding 111 and the output windings 112X and 112Y for respectively outputting the X direction component and the Y direction component of the rotor will be described with reference to FIG. 16.

In the case where the direction of magnetization generated by a voltage induced by the excitation winding 111 in the output winding 112X for outputting the X direction component of the rotor is the same as the direction of magnetization of the excitation winding 111, a voltage ENS induced at any one of the poles can be expressed by Equation 1 when an AC voltage VP as expressed in E sin ωt is applied to the excitation winding 111, where ω represents an angular frequency which is expressed as 2πf, f represents a frequency, a and b are constants defined by characteristics of the excitation winding 111, the output winding 112X, the rotor and the stator.

$$ENS=(a+b \sin \theta) \cdot E \sin \omega t \qquad \text{(Eq. 1)}$$

On the other hand, in the case where the direction of magnetization generated by the voltage induced by the excitation winding 111 in the output winding 112X is different from the direction of magnetization of the excitation winding 111, a voltage ENN induced at any one of the poles can be expressed by Equation 2.

$$ENN=(-a+b \sin \theta) \cdot E \sin \omega t \qquad \text{(Eq. 2)}$$

The relationship between the excitation winding and the output winding to be wound around any one of the poles is defined as illustrated in FIG. 16. In the case where the windings wound around the first pole and the second pole in such a structure are connected in series, the resultant voltage V12 can be expressed by Equation 3 below in view of the above-mentioned Equations 1 and 2.

$$V12=(a+b \sin \theta) \cdot E \sin \omega t+(-a+b \sin \theta) \cdot E \sin \omega t \qquad \text{(Eq. 3)}$$

Similarly, a voltage V34 expressed in Equation 4 is generated by the third and fourth poles.

$$V34=(-a+b \sin \theta) \cdot E \sin \omega t+(a+b \sin \theta) \cdot E \sin \omega t \qquad \text{(Eq. 4)}$$

From Equations 3 and 4, the terms with the constant a are eliminated in the case where the adjacent poles are connected in series, so that voltages V12 and V34 as expressed in Equation 5 can be obtained.

$$V12=2b \sin \theta \cdot E \sin \omega t=V34 \qquad \text{(Eq. 5)}$$

Accordingly, when the output windings of all of the poles are connected in series in the case where the number of the poles is a multiple of 2, the terms with the constant a are eliminated so that an output voltage VS from the output winding 112X can be expressed by Equation 6.

$$VS = K \sin\theta \cdot E \sin\omega t \quad \text{(Eq. 6)}$$

In the equation, K is a constant defined in accordance with the constant b and the number of poles, and is expressed by Equation 7 where N represents the number of poles.

$$K = N \cdot B \quad \text{(Eq. 7)}$$

Similarly, an output from the output winding 112Y for outputting the Y direction component of the rotor can be expressed by Equation 8, since the output winding 112Y is wound around so that the phase thereof is shifted by 90° with respect to the rotor.

$$VC = K \cos\theta \cdot E \sin\omega t \quad \text{(Eq. 8)}$$

When output voltages from the above-mentioned resolver are applied to the square calculators 121X and 121Y in FIG. 15, the square calculators 121X and 121Y respectively provide voltage outputs as expressed in Equations 9 and 10.

$$VSX = VS^2 = K^2 \cdot \sin\theta^2 \cdot E^2 \sin^2\omega t \quad \text{(Eq. 9)}$$

$$VCY = VC^2 = K^2 \cdot \cos\theta^2 \cdot E^2 \sin^2\omega t \quad \text{(Eq. 10)}$$

Accordingly, an output VE of the adder 123 obtained by summing up the outputs of the square calculators 121X and 121Y can be expressed as Equation 11.

$$VE = K^2 \cdot E^2 \sin^2\omega t \cdot (\sin^2\theta + \cos^2\theta) \quad \text{(Eq. 11)}$$

When the excitation winding 111 and the output windings 112X and 112Y for respectively outputting the X direction component and the Y direction component of the rotor operate normally, the term $(\sin^2\theta + \cos^2\theta)$ is always 1. Accordingly, the output VE always has a constant value as expressed in Equation 12 irrespective of the value of rotation angle θ.

$$VE = K^2 \cdot E^2 \sin^2\omega t \quad \text{(Eq. 12)}$$

However, even when the resolver operates normally, the value of $\sin^2\theta$ becomes 0 when the rotation angle θ is 0°, resulting in the output from the output winding 112X for outputting the X direction component of the rotor being zero. On the other hand, if the output winding 112X is short-circuited, the output voltage from the output winding 112X also becomes zero. Accordingly, it cannot be recognized whether the output becomes zero because the rotation angle θ of the output winding 112X is 0° or because the output winding 112X is short-circuited.

Similarly, even when the resolver operates normally, the value of $\cos^2\theta$ becomes 0 when the rotation angle θ is 90°, resulting in the output voltage from the output winding 112Y for outputting the Y direction component of the rotor being zero. On the other hand, if the output winding 112Y is short-circuited, the output voltage from the output winding 112Y also becomes zero. Accordingly, it cannot be recognized whether the output voltage becomes zero because the rotation angle θ of the output winding 112Y is 90° or because the output winding 112Y is short-circuited.

As set forth above, in the conventional variable reluctance resolver, there is no output terminal provided at the middle point in each of the output windings 112X and 112Y. Accordingly, only the voltage across the opposite output terminals of the output winding 112X and the voltage across the opposite output terminals of the output winding 112Y are obtained. The fault detection circuit is also configured to detect a fault by means of the sum of squared values of the respective output voltages using the above voltage.

Since the sum of the squared values of the output voltages across the output windings 112X and 112Y is used as a detection signal, a constant output voltage can be always obtained when the resolver operates normally, while the value thereof changes when a fault occurs, thereby realizing a fault detection. However, even when the resolver operates normally, the value of $\sin^2\theta$ becomes 0 with the rotation angle θ being 0° so that the output voltage from the output winding 112X becomes 0.

On the other hand, the output voltage from the output winding 112X also becomes 0 when the output winding 112X is short-circuited. Accordingly, the conventional structure has a disadvantage in which it cannot be recognized whether the output becomes zero because the rotation angle θ of the output winding 112X is 0° or because the output winding 112X is short-circuited.

Similarly, even when the resolver operates normally, the value of $\cos^2\theta$ becomes 0 with the rotation angle θ being 90° so that the output voltage from the output winding 112Y which outputs the Y direction component of the rotor becomes 0. On the other hand, the output voltage from the output winding 112Y also becomes 0 when the output winding 112Y is short-circuited. Accordingly, the conventional structure has a disadvantage in which it cannot be recognized whether the output becomes zero because the rotation angle θ of the output winding 112Y is 90° or because the output winding 112Y is short-circuited.

As set forth above, the conventional resolver cannot detect a fault at a specific rotation angle of a rotor when an accident is resulted from short-circuiting, and therefore, the fault detection is not operated accurately. Furthermore, since a difference between an amplitude when a fault occurs and an amplitude when a resolver operates normally is detected, a signal-to-noise ratio cannot be set at a large value. In addition, upon the fault detection, a fault in the output winding 112X for outputting the X direction component of the rotor of the resolver and a fault in the output winding 112Y for outputting the Y direction component thereof are not distinguished. Accordingly, it cannot be distinguished whether the fault occurs in the output winding 112X or in the output winding 112Y. This is not appropriate for obtaining data to be used for an accident analysis.

Furthermore, with development of electric vehicles or the like, it has been attempted to replace a power steering device driven by oil-pressure for automobiles or the like with a resolver. However, the conventional resolver is inappropriate to be used in automobiles in which emphasis should be placed upon safety, since it may not be able to determine whether or not a fault occurs even when a fault actually occurs in the resolver.

SUMMARY OF THE INVENTION

In order to overcome the above-mentioned disadvantages in the conventional art, the present invention is intended to provide a resolver having a structure in which a fault such as short-circuiting among windings or the like can be easily detected, a fault detection circuit for realizing the above, and a fault detection method utilizing the above circuit. In order to achieve the above-mentioned objective, a resolver in accordance with a first aspect of the present invention comprising a stator, a rotor, an excitation winding and an output winding, characterized in that an output terminal is provided at a middle point between opposite end terminals of the output winding.

Another resolver in accordance with a second aspect of the present invention comprising a stator, a rotor, an excitation winding and an output winding, the excitation winding and the output winding being wound around the identical pole of the stator, characterized in that an output terminal is provided at a middle point between opposite end terminals of the output winding.

In accordance with a third aspect of the present invention, a resolver fault detection circuit to be used for a resolver comprising a stator, a rotor, an excitation winding and an output winding, is provided. The circuit comprises: an output terminal provided at a middle point between opposite end terminals of the output winding; a difference voltage detection circuit for obtaining a difference voltage between a first output voltage, between one of the opposite end terminals of the output winding of the resolver and the middle point, and a second output voltage, between the other one of the opposite end terminals of the output winding and the middle point; and a comparator circuit for outputting a signal as a fault signal when an output voltage from the difference voltage detection circuit deviates from a reference value.

A resolver fault detection method is provided in accordance with a fourth aspect of the present invention so as to be used for a resolver comprising a stator, a rotor, an excitation winding and an output winding, characterized in that the method comprises the step of obtaining a fault detection signal from a resolver fault detection circuit to detect that the resolver is faulty. The resolver fault detection circuit comprises: an output terminal provided at a middle point between opposite end terminals of the output winding; a difference voltage detection circuit for obtaining a difference voltage between a first output voltage, between one of the opposite end terminals of the output winding of the resolver and the middle point, and a second output voltage, between the other one of the opposite end terminals of the output winding and the middle point; and a comparator circuit for outputting a signal as a fault signal when an output voltage from the difference voltage detection circuit deviates from a reference value.

Another resolver fault detection method in accordance with a fifth aspect of the present invention comprises the steps of: obtaining a fault detection signal of a resolver fault detection circuit, the fault detection signal indicating a fault of a first output winding for outputting an X direction component of a rotor; obtaining a fault detection of the resolver fault detection circuit, the second signal indicating a fault of a second output winding for outputting a Y direction component of the rotor; and obtaining a logical sum of the first signal and the second signal as a fault detection signal.

As set forth above, in accordance with the present invention, a resolver comprising a rotor, a stator, an excitation winding and an output winding is configured so that an output terminal is provided at the middle point,-in the output winding. Thus, a difference voltage between a first output voltage, between one end of the output winding and the middle point, and a second output voltage, between the other end of the output winding and the middle point, can be obtained.

When no fault occurs, the first output voltage between one end of the output winding and the middle point has the same value as the second output voltage between the other end of the output winding and the middle point. Accordingly, an output voltage from the difference voltage detection circuit for obtaining a difference between the above-mentioned first and second output voltages becomes zero when no fault occurs in the output winding, while the difference voltage detection circuit outputs a difference voltage when a fault occurs at some point in the output winding.

When a fault occurs in the output winding, the output from the difference voltage detection circuit is shifted from a reference value. The comparator circuit provides an output as a fault signal to indicate that an fault occurs in the resolver. The fault in the output winding can include short-circuiting in the identical output winding, short-circuiting between the different output windings, short-circuiting between the excitation winding and the output winding, or the like. In either case, the difference value voltage comes to have a non-zero value when something extraordinary occurs, thereby functioning to detect a fault. A variable reluctance resolver is applicable to various fields in automobiles including, other than to an electric power steering system, e.g., a hybrid car system, an electric vehicle system, a braking-by-wire system, a suspension-by-wire system, an accelerator-by-wire system, a valve control system, a stator alternator system, or the like. Furthermore, a variable reluctance resolver is also applicable to other fields such as control of various robots, or control of a servomotor.

BRIEF DESCRIPTION OF THE DRAWINGS

FIG. 11 is a table showing actually measured data indicating how the difference voltage of the resolver behaves as a rotation angle of the rotor is varied, both in the case where the output winding 112X operates normally and in the case where part of the output winding 112X is suffered from short-circuiting, with respect to one embodiment of the resolver in accordance with the present invention.

FIG. 12 is a table showing actually measured data indicating how the difference voltage of the resolver behaves as a rotation angle of the rotor is varied, both in the case where the excitation winding 111 operates normally and in the case where part of the excitation winding 111 is suffered from short-circuiting, with respect to one embodiment of the resolver in accordance with the present invention.

DETAILED DESCRIPTION OF THE PREFERRED EMBODIMENTS

Figure 1:
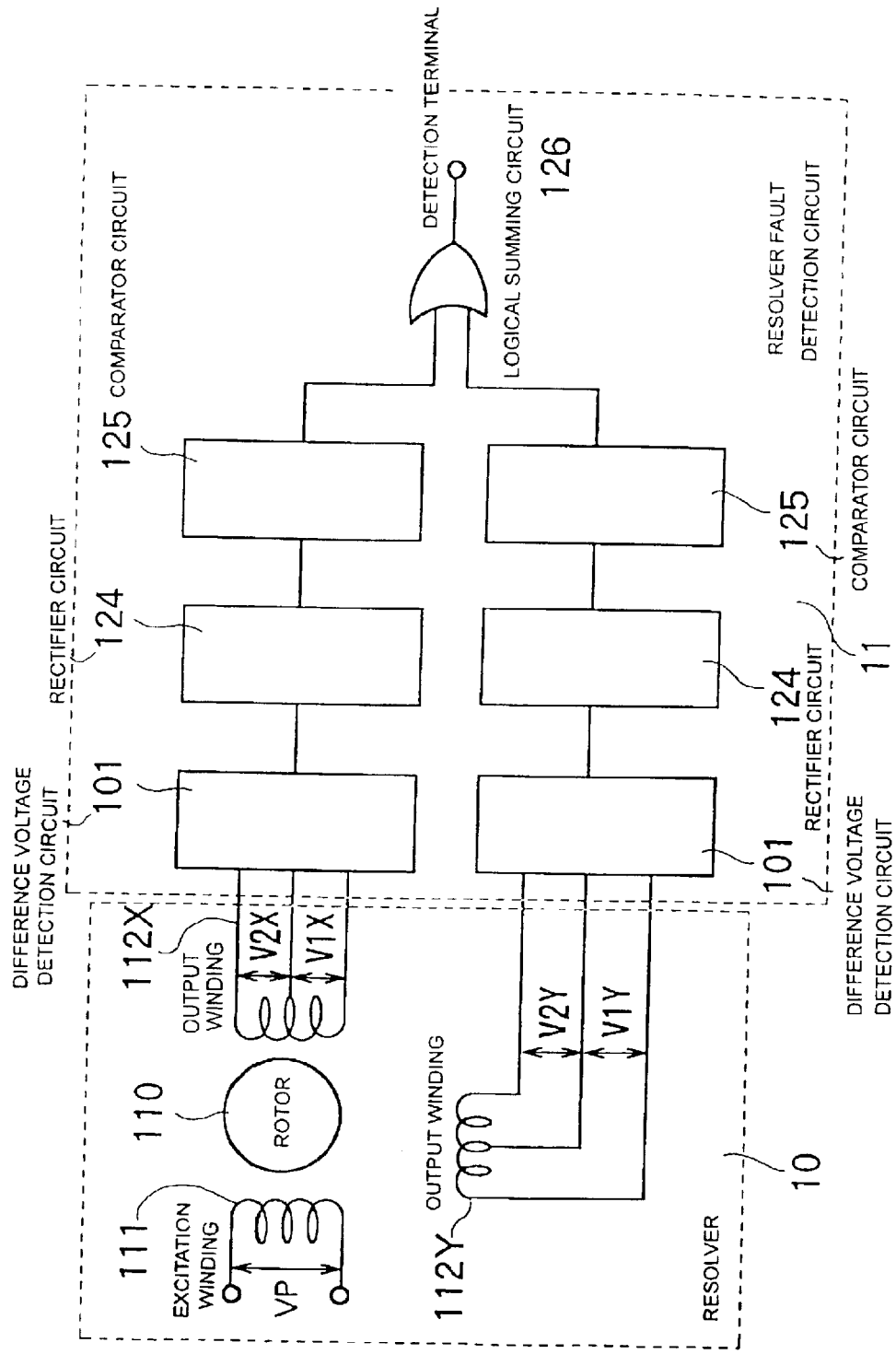
FIG. 1 is a block diagram for illustrating a resolver and a resolver fault detection circuit in accordance with the present invention.
Figure 17:
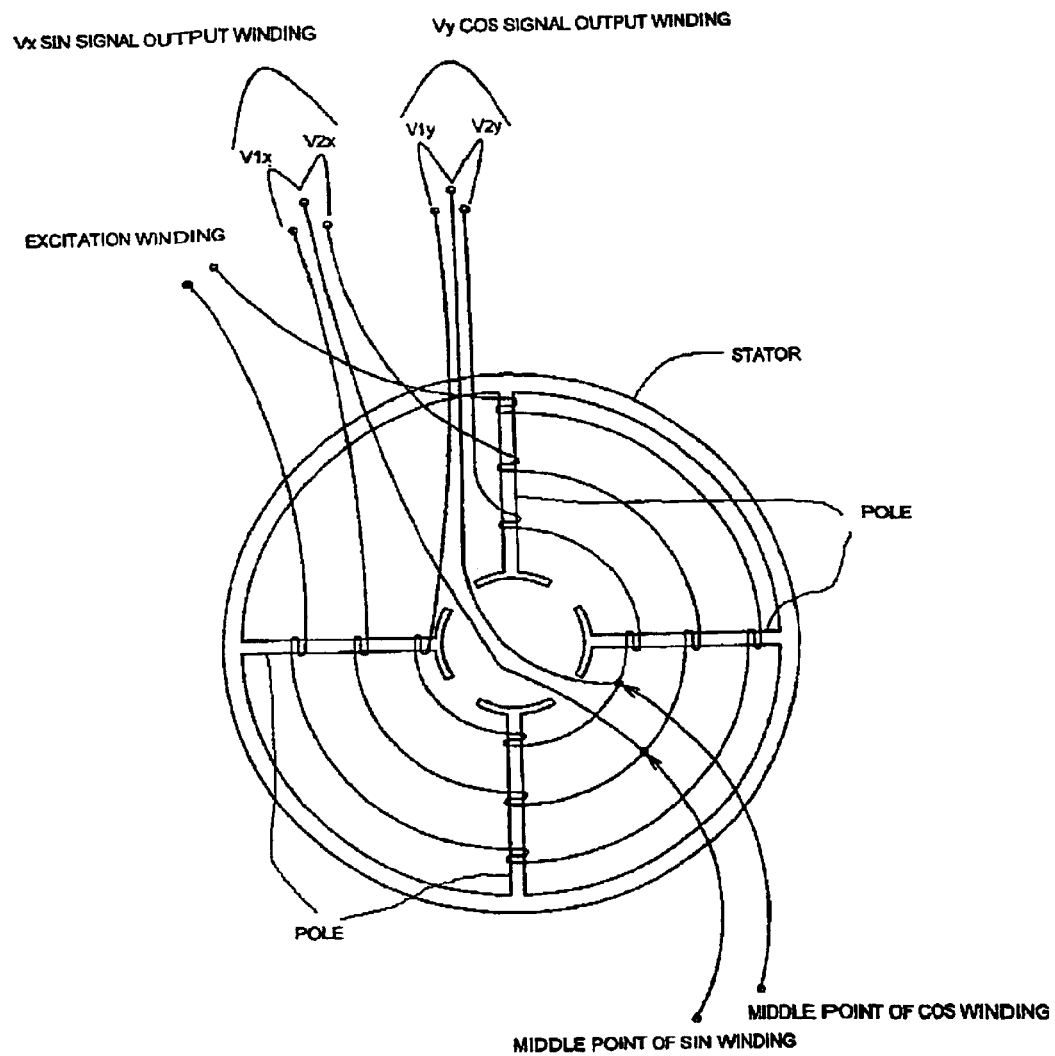
FIG. 17 shows a stator according to an embodiment of the present invention.

A resolver and a resolver fault detection circuit in accordance with the present invention will be described with reference to FIG. 1. First, a resolver 10 will be described. In FIG. 1, the resolver 10 includes a stator (see FIG. 17), a rotor 110, an excitation winding 111 wound around the stator, an output winding 112X for outputting an X direction component of the rotor 110 of the resolver 10, and an output winding 112Y for outputting a Y direction component of the rotor 110 of the resolver 10. The stator is provided with 16 poles, and the excitation winding 111 and the output windings 112X and 112Y are wound around the identical pole of the stator, as shown in FIG. 17.

Portions of the output winding 112X respectively wound around the 16 poles are connected in series to form one output winding 112X. Similarly, portions of the output winding 112Y respectively wound around the 16 poles are connected in series to form one output winding 112Y. The case where an output terminal is provided at the middle point between opposite end terminals of each of the output windings will be described. More specifically, an output terminal is provided at the output winding 112X between the eighth and ninth poles, while an output terminal is also provided at the output winding 112Y between the eighth and ninth poles.

Figure 16:
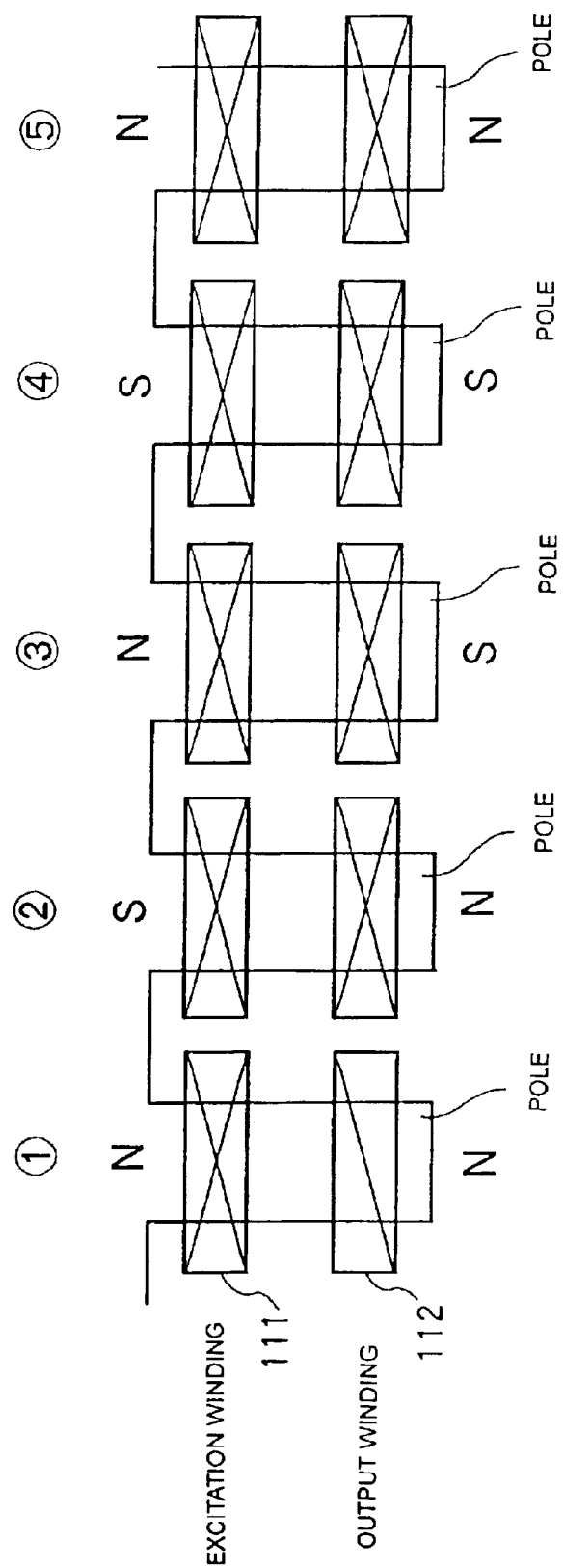
FIG. 16 is a diagram for explaining the relationship between the excitation winding and the output winding in the conventional variable reluctance resolver.

The output winding 112X for outputting the X direction component of the rotor when a voltage VP expressed as E sin ωt is applied to the excitation winding 111 will be described. The relationship between the excitation winding 111 and the output windings 112X to be wound around any one of the poles is defined as shown in FIG. 16. With respect to the polarity of the output winding 112X, the output voltage for every two poles is expressed as Equation 5. Thus, each of an output voltage V2X for the first to eighth poles and an output voltage V1X for the ninth to sixteenth poles is four times as large as the value obtained by Equation 5, and is expressed as Equation 13.

$$V2X = V1X = 8b \sin\theta \cdot E \sin\omega t \quad \text{(Eq. 13)}$$

With respect to the output winding 112Y, an output voltage V2Y for the first to eighth poles and an output voltage V1Y for the ninth to sixteenth poles can be similarly obtained.

Then, a resolver fault detection circuit 11 will be described. The output winding 112X of the resolver 10 is connected to one of the difference voltage detection circuits 101, while the output winding 112Y of the resolver 10 is connected to the other of the difference voltage detection circuits 101. The portion of the circuit 11 associated with the output winding 112X will be described below.

Among an output from the output winding 112X of the resolver 10, the output voltage V2X from one of the output terminals of the output winding 112X to the middle point and the output voltage V1X from the other of the output terminals of the output winding 112X to the middle point are applied to the difference voltage detection circuit 101, and a difference between the output voltages V2X and V1X is calculated. With no fault, the output voltages V2X and V1X are equal to each other, thereby the difference between them being zero.

When short-circuiting is occurred at any one of the poles, the relationship expressed by Equation 13 is no longer satisfied, so that a difference component between the output voltages V2X and V1X is outputted to the difference voltage detection circuit 101. An output from the difference voltage detection circuit 101 is an AC voltage, and therefore is applied to a rectifier circuit 124 prior to input to a comparator circuit 125 in which comparison with a DC voltage is to be conducted. For example, when a portion of the output winding corresponding to one pole on the side where the output voltage V2X is generated is short-circuited, the difference component between the output voltages V2X and V1X can be expressed as Equation 14 below.

$$V2X = (-a + 7b \sin\theta) \cdot E \sin\omega t \quad \text{(Eq. 14)}$$

Since the output voltage V1X comes to have a value expressed by Equation 13, a difference component VER between the output voltage V2X and the output voltage V1X will be expressed as Equation 15.

$$VER = -(a + b \sin\theta) \cdot E \sin\omega t \quad \text{(Eq. 15)}$$

As can be clearly seen from Equation 15, the term of a·E sin ωt which is independent on the rotation angle θ of the rotor can be detected as the difference component VER between the output voltages V2X and V1X, and thus the above result can be interpreted to indicate a fault. In this case, it is clear that the VER can be obtained even with θ=0°.

Outputs from the rectifier circuits 124 are input to the corresponding comparator circuits 125, respectively. Each of the comparator circuits 125 compares an analog voltage signal indicating the difference voltage between the output voltages V2X and V1X, i.e., an output voltage from the rectifier circuit 124, with a reference voltage not illustrated. When the analog voltage signal exceeds the reference voltage, a comparison output as a signal indicating a fault in the resolver is provided to be supplied to one of inputs of a logical summing circuit 126.

With respect to the output winding 112Y for outputting the direction component of the rotor, a comparison output as a signal indicating a fault in the resolver is similarly obtained to be supplied to another input of the logical summing circuit 126.

The logical summing circuit 126 is provided for detecting a fault in the output windings 112X and 112Y. When a fault occurs in either of the output windings 112X and 112Y, or both of them, a logical sum of the comparison outputs from the comparison circuits 125 respectively corresponding to the output windings 112X and 112Y is output to a detection terminal.

Figure 2:
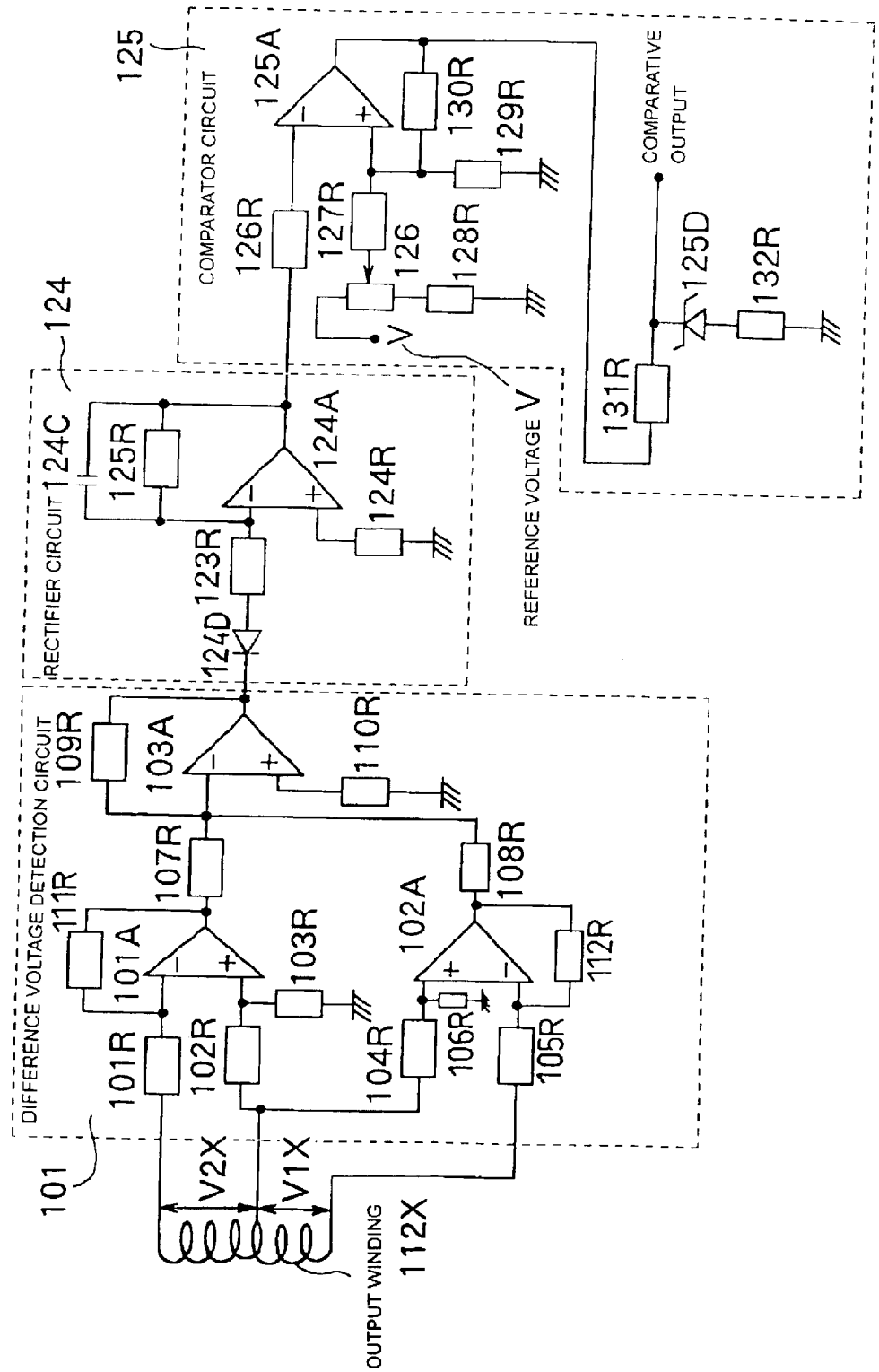
FIG. 2 is a diagram illustrating one embodiment of the resolver fault detection circuit shown in FIG. 1.

FIG. 2 more specifically illustrates the resolver fault detection circuit that operates in response to the output winding 112X in FIG. 1. Although not illustrated, a circuit to operate in response to the output winding 112Y can be similarly constructed.

In FIG. 2, the difference voltage detection circuit 101 is connected to the output winding 112X of the resolver. In the difference voltage detection circuit 101, one of the outputs from the output winding 112X of the resolver is connected to a resistor 101R, while the other output from the output winding 112X is connected to a resistor 105R. The middle point of the output winding 112X is connected to resistors 102R and 104R. The voltage V2X is applied between the resistors 101R and 102R, while the voltage V1X is applied between the resistors 104R and 105R.

One of the outputs from the output winding 112X is connected to an inverted input of an amplifier 101A via the resistor 101R, while the other output from the output winding 112X is connected to an inverted input of an amplifier 102A via the resistor 105R. Accordingly, the output voltage V2X obtained through amplification by an operational amplifier composed of the resistors 101R, 102R, 103R, 111R and the amplifier 101A has the polarity opposite to that of the output voltage V1X obtained through amplification by an operational amplifier composed of the resistors 104R, 105R, 106R, 112R and the amplifier 102A.

Thus, by connecting outputs from the amplifiers 101A and 102A to resistors 107R and 108R, respectively, to be summed up by an operational amplifier composed of resistors 107R, 108R, 109R, 110R and an amplifier 103A, a difference between the output voltages V2X and V1X having the opposite polarities can be obtained.

An output from the amplifier 103A is subjected to half-wave rectification by a diode 124D in the rectifier circuit 124, and then smoothed by a smoothing circuit composed of resistors 123R, 124R, 125R, a capacitor 124C, and an amplifier 124A. An output from the amplifier 124A is-supplied to the comparator circuit 125.

The comparator circuit 125 is composed of a reference voltage V for setting a reference value for determination of whether it is in a normal condition or in a faulty condition, a reference voltage setting device 126, resistors 126R, 127R, 129R, 130R, an amplifier 125A, resistors 131R, 132R, and a Zener diode 125D. The comparator circuit 125 applies the output of the rectifier circuit 124 to one of the inputs of the amplifier 125A via the resistor 126R, while applying the output from the reference voltage setting device 126 to the other input of the amplifier 125A via the resistor 127R as a reference value, to perform comparison of the analog voltages.

The reference voltage is provided for eliminating error components due to various reasons such as variations in characteristics at the poles of the excitation winding 111 and the output winding 112X, misalignment of the windings, or the like, to allow the resolver fault detection circuit to stably operate. Thus, the reference voltage is adjusted to be a different value for every resolver.

An output from the amplifier 125A is converted into a logical circuit level by the resistors 131R, 132R and the diode 125D to be supplied to one of the inputs of the logical summing circuit 126 as the comparison output of the comparator circuit 125.

Figure 3:
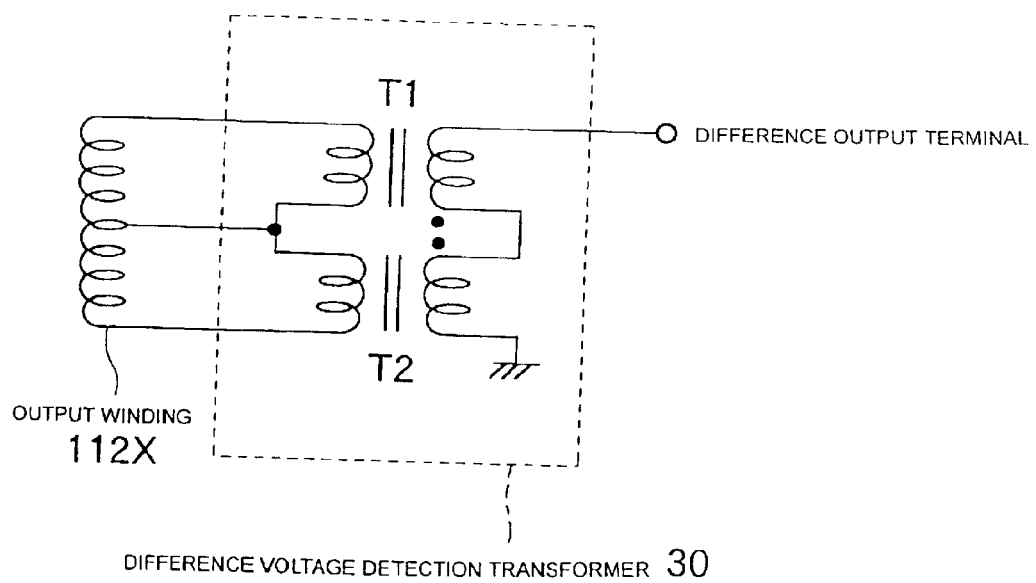
FIG. 3 illustrates one embodiment in which a transformer is used as the difference voltage detection circuit.

FIG. 3 illustrates one embodiment in which a transformer is used as the difference voltage detection circuit. Although the illustrated circuit is intended to operate in response to the output winding 112X, a circuit to operate in response to the output winding 112Y can be also configured similarly.

A difference voltage detection transformer 30 includes two transformers T1 and T2 connected in series such that their respective output windings have opposite polarities. The respective end terminals of the output winding 112X are connected to opposite input ends of the transformers T1 and T2 in series connection, respectively, while the middle point of the output winding 112X is connected to a connecting node of the input ends of the transformers T1 and T2 in series connection.

In such a construction, since the transformers T1 and T2 are connected in series to a difference output terminal of the difference voltage detection transformer 30 so that they have output polarities opposite to each other, an output from the output winding 112A, i.e., a difference between the output voltage V2X for the first to the eighth poles and the output voltage V1X for the ninth to the sixteenth poles, can be obtained at the difference output terminal of the difference voltage detection transformer 30.

Figure 4:
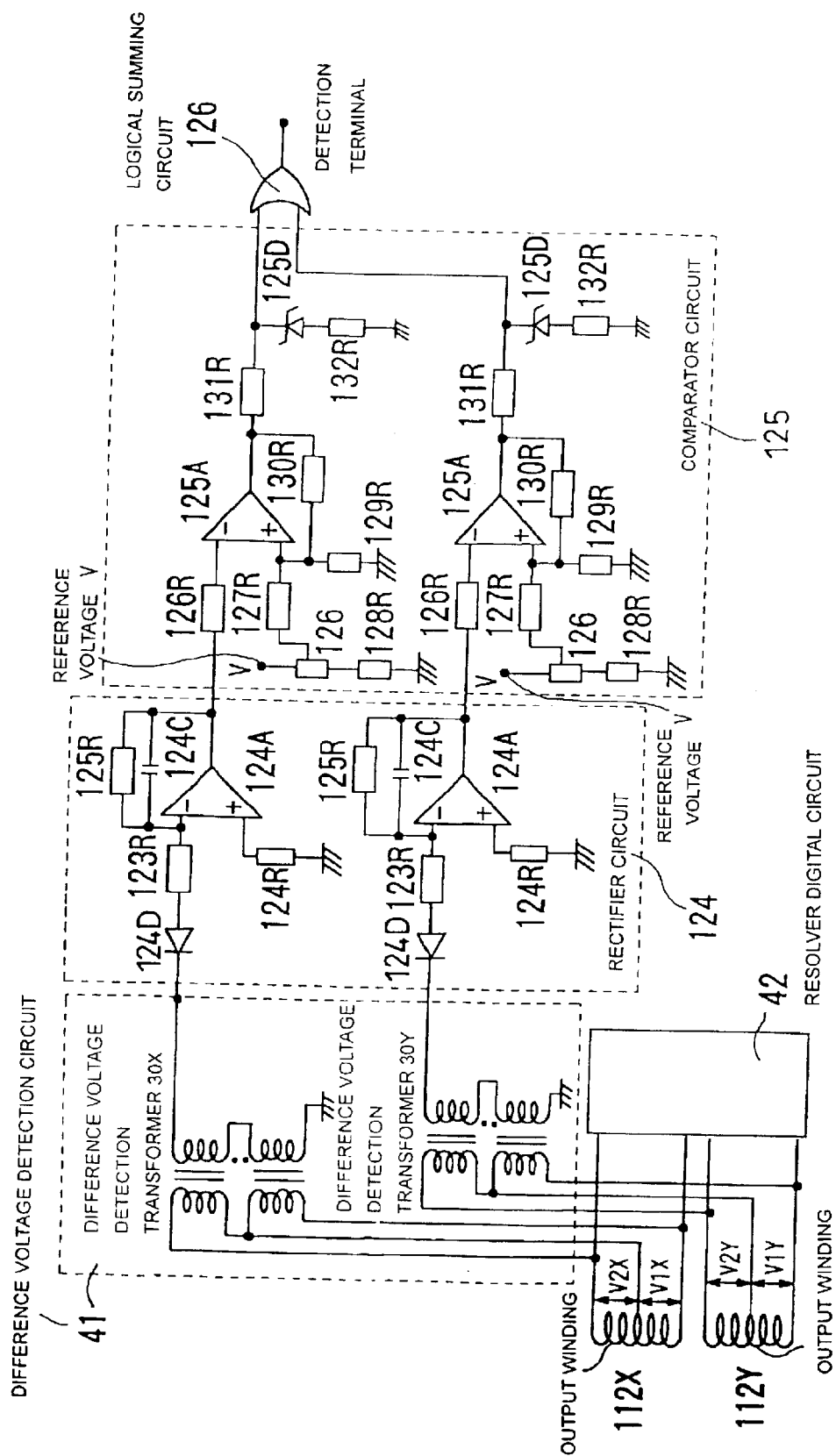
FIG. 4 illustrates one embodiment of the resolver fault detection circuit in accordance with the present invention in which a transformer is used as the difference voltage detection circuit.

FIG. 4 illustrates one embodiment of the resolver fault detection circuit in which a transformer is used as the difference voltage detection circuit. The difference voltage detection circuit 41 and a resolver digital circuit 42 are connected to the output windings 112X and 112Y of the resolver.

The resolver digital circuit 42 provides an digital output in accordance with a rotation angle of the resolver. Although this resolver digital circuit 42 is not directly related to the resolver and the resolver fault detection circuit of the present invention, the circuit 42 is illustrated in FIG. 4 as part of the circuit configuration to be actually employed.

The rectifier circuit 124 includes two sets of rectifier circuits. One of these sets is used for rectifying a difference voltage of the output winding 112X, while the other set is used for rectifying a difference voltage of the output winding 112Y. The difference voltage detection circuit 41 is composed of a difference voltage detection transformer 30X for detecting a fault in the output winding 112X and a difference voltage detection transformer 30Y for detecting a fault in the output winding 112Y. One of outputs of the difference voltage detection transformer 30X is connected to an input of one set in the rectifier circuit 124, while the other output of the difference voltage detection transformer 30X is grounded. In addition, one of outputs of the difference voltage detection transformer 30Y is connected to an input of the other set in the rectifier circuit 124, while the other output of the difference voltage detection transformer 30Y is grounded.

As described previously, a difference between the output voltages V2X and V1X is calculated by the difference voltage detection transformer 30X. With no fault, the output voltages V2X and V1X are equal to each other, thereby the difference between them being zero.

When short-circuiting is occurred at any one of the poles, the relationship expressed by Equation 13 is no longer satisfied, so that a difference component between the output voltages V2X and V1X is outputted to the difference voltage detection transformer 30X to be applied to the rectifier circuit 124.

Similarly, a difference between the output voltages V2Y and V1Y is calculated by the difference voltage detection transformer 30Y. With no fault, the output voltages V2Y and V1Y are equal to each other, thereby the difference between them being zero. When short-circuiting is occurred at any one of the poles, the relationship expressed by Equation 13 is no longer satisfied, so that a difference component between the output voltages V2Y and V1Y is outputted to the difference voltage detection transformer 30Y to be applied to the rectifier circuit 124.

An output from the difference voltage detection transformer 30X is rectified and smoothed by a half-wave rectifier circuit composed of a diode 124D, resistors 123R, 124R, 125R, a capacitor 124C and an amplifier 124A before being supplied to an input of one set in the comparator circuit 125.

Similarly, an output from the difference voltage detection transformer 30Y is rectified and smoothed by another half-wave rectifier circuit composed of a diode 124D, resistors 123R, 124R, 125R, a capacitor 124C and an amplifier 124A before being supplied to an input of the other set in the comparator circuit 125.

The comparator circuit 125 is composed of a reference voltage V for setting a reference value for determination of whether it is in a normal condition or in a faulty condition, a reference voltage setting device 126, resistors 126R, 127R, 129R, 130R, an amplifier 125A, resistors 131R, 132R, and a Zener diode 125D. The comparator circuit 125 applies the output of the rectifier circuit 124 to one of the inputs of the amplifier 125A via the resistor 126R, while applying the output from the reference voltage setting device 126 to the other input of the amplifier 125A via the resistor 127R, to perform comparison of the analog voltages.

The reference value is provided for eliminating error components due to various reasons such as variations in characteristics at the poles of the excitation winding 111 and the output winding 112X, misalignment of the windings, or the like, to allow the resolver fault detection circuit to stably operate. Thus, the reference value is adjusted to be a different value for every resolver.

An output from each of the amplifiers 125A is converted into a logical circuit level by a set of the resistors 131R, 132R and the Zener diode 125D to be supplied to one of the inputs of the logical summing circuit 126 as the comparison output of the comparator circuit 125.

The logical summing circuit 126 is provided for detecting a fault in the output windings 112X and 112Y. When a fault occurs in either of the output windings 112X and 112Y, or both of them, a logical sum of the comparison outputs from the comparator circuits 125 is output to a detection terminal.

It should be appreciated that the number of poles of the resolver is not limited to 16. With respect to a rare accident, for example, in the output winding 112X or the output winding 112Y, in which two poles, for one of which the direction of magnetization generated by a voltage induced in the output winding 112X by the excitation winding 111 is the same as the direction of magnetization of the excitation winding 111 and for another of which the direction of magnetization generated by a voltage induced in the output winding 112X by the excitation winding 111 is different from the direction of magnetization of the excitation winding 111, are simultaneously suffered from short-circuiting, the difference component VER between the output voltages V2X and V1X is expressed as Equation 16 in view of the Equations 1 and 2. Specifically, the difference component VER between the output voltages V2X and V1X becomes dependent on the rotation angle θ of the rotor.

$$VER = -2b \sin \theta \cdot E \sin \omega t \quad \text{(Eq. 16)}$$

Accordingly, in such a case, an accident cannot be detected at θ=0°. However, such a situation occurs only very rarely, where in the same winding, two poles, for one of which the direction of magnetization generated by a voltage induced in the output winding 112X by the excitation winding 111 is the same as the direction of magnetization of the excitation winding 111 and for another of which the direction of magnetization generated by a voltage induced in the output winding 112X by the excitation winding 111 is different from the direction of magnetization of the excitation winding 111, are simultaneously suffered from short-circuiting and the rotation angle θ stands at 0°, and therefore, adverse effects associated with such a situation is negligible under practical situations. The same is true with respect to the output winding 112Y.

FIGS. 11, 5, 6, and 7 respectively shows actually-measured results of the difference voltages and its linearity, and the angular errors, both in the case where part of the output windings 112X is suffered from short-circuiting and in the normal situation with respect to the resolver in accordance with the present invention.

FIG. 11 shows the actually-measured values of the difference voltages, both in the case where the output winding operates normally and in the case where part of the poles thereof is suffered from short-circuiting, with various rotation angles of the rotor. In FIG. 11, the term "7-8 short" means that a quarter of the winding at any one of the poles in the output winding is short-circuited. Similarly, the terms "7-9 short" and "7-S short" respectively mean that a half and three quarters of the winding at any one of the poles in the output winding is short-circuited.

Figure 5:
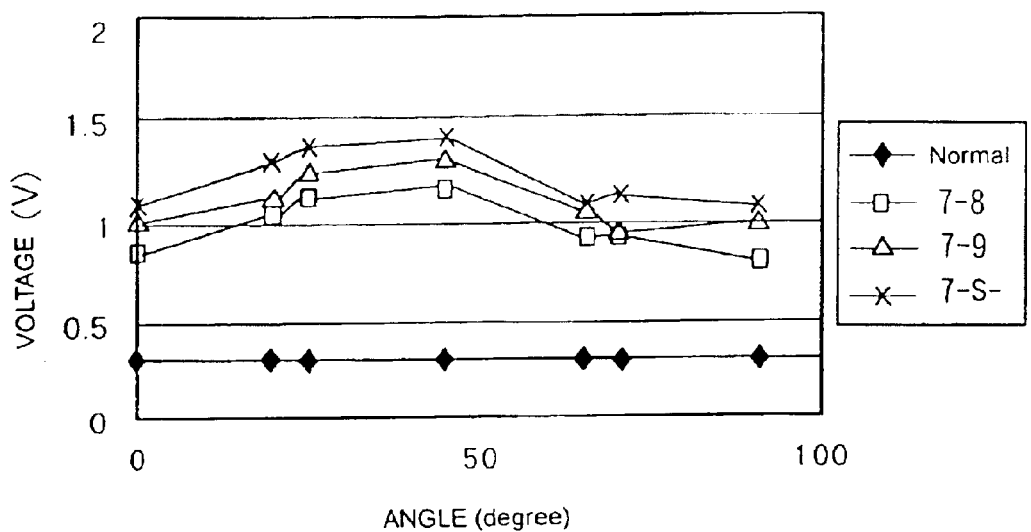
FIG. 5 is a graph showing actually measured data of the difference voltages both in the case where the output winding 112X operates normally and in the case where part of the output winding 112X is suffered from short-circuiting, with respect to one embodiment of the resolver in accordance with the present invention.

FIG. 5 shows a graph obtained based on the data in FIG. 11, where the horizontal axis represents the rotation angles of the rotor and the vertical axis represents the difference voltages. It can be clearly understood from FIG. 5 that when any part of the output winding is suffered from short-circuiting, a stable output can be obtained irrespective of the rotation angles. In particular, unlike in the conventional art, a fault can be detected irrespective of the specific rotation angle of the rotor.

In FIG. 11 or FIG. 5, when the output winding operates normally, the difference voltage of 0.32 V appears irrespective of the rotation angle. This is an error voltage due to various reasons such as non-uniformity of the winding, non-uniformity of a shape of the rotor, a fabrication error of the stator poles, eccentricity of the rotor, or the like. The fault detection can be performed without any disadvantages by setting the reference value by the reference voltage setting device 126 at a value exceeding the above-mentioned error voltage.

Figure 6:
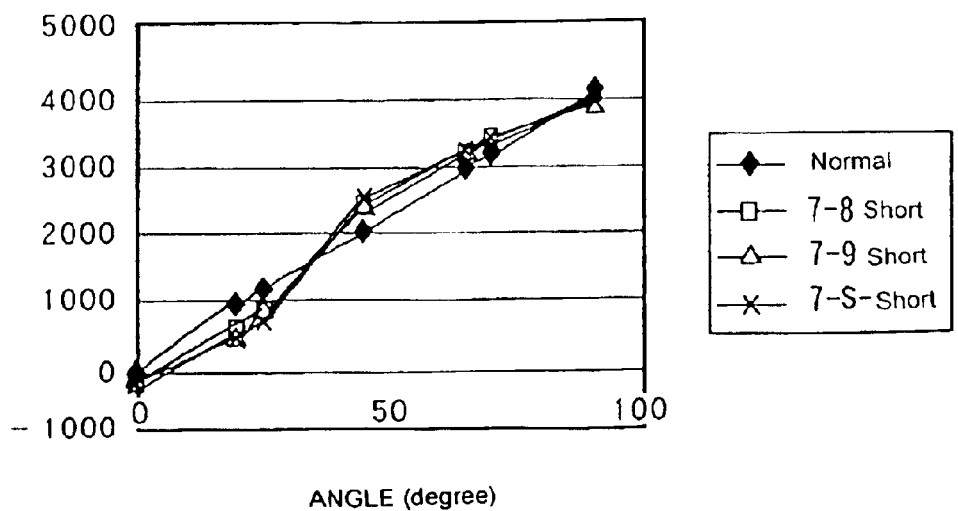
FIG. 6 is a graph showing the linearity of the resolver in accordance with the present invention both in the case where the output winding 112X operates normally and in the case where part of the output winding 112X is suffered from short-circuiting, with respect to one embodiment of the resolver in accordance with the present invention.

FIG. 6 is a graph showing the measured results of the outputs from the resolver digital circuit 42 shown in FIG. 4, where the vertical axis represents the outputs of the resolver digital circuit 42 and the horizontal axis represents the rotation angles of the rotor. FIG. 6 shows that the outputs in proportion to the rotation angle θ can be obtained, as in the conventional resolver having no output terminal being provided at the middle point in the output winding.

Figure 7:
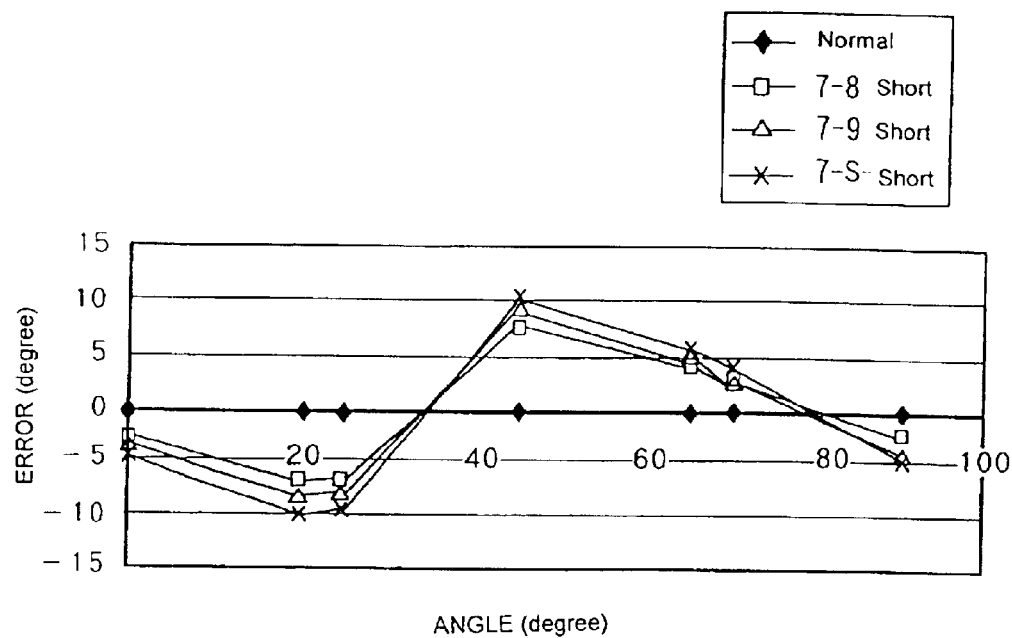
FIG. 7 is a graph showing only error components in the linear output shown in FIG. 6.

FIG. 7 is a graph showing only error components in the linear output shown in FIG. 6, where the vertical axis represents the angular errors and the horizontal axis represents the rotation angles. It can be seen from FIG. 7 that the angular error is zero when the output winding operates normally, while some angular error is generated when part of the poles is suffered from short-circuiting. The thus-generated angular error is varied in accordance with the rotation angle of the rotor, resulting in the deteriorated linearity.

FIGS. 12, 8, 9, and 10 respectively shows actually-measured results of the difference voltages and its linearity, and the angular errors, both in the case where part of the excitation windings 111 is suffered from short-circuiting and in the normal situation with respect to the resolver in accordance with the present invention.

FIG. 12 shows the actually-measured values of the difference voltages, both in the case where the excitation winding operates normally and in the case where part of the poles thereof is suffered from short-circuiting, with various rotation angles of the rotor. In FIG. 12, the term "1-2 short" means that a quarter of the winding at any one of the poles in the output winding is short-circuited. Similarly, the terms "1-3 short" and "1-R short" respectively mean that a half and three quarters of the winding at any one of the poles in the output winding is short-circuited.

Figure 8:
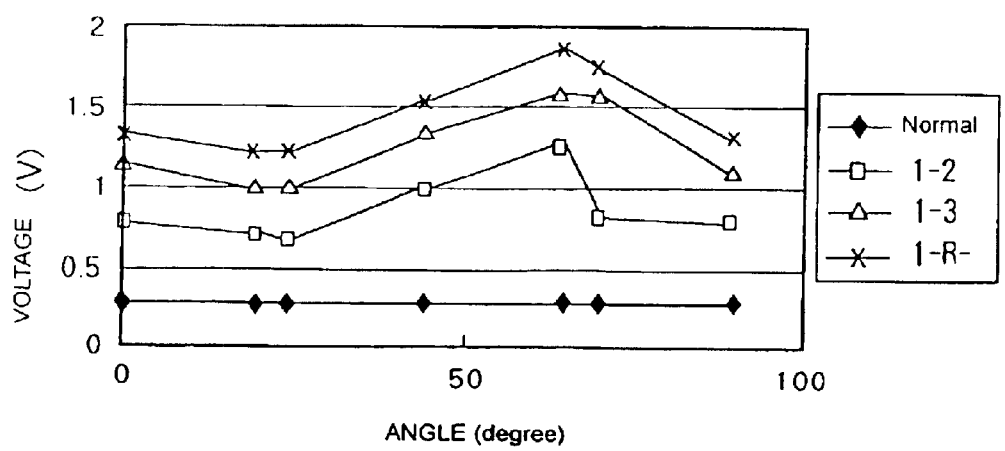
FIG. 8 is a graph showing actually measured data of the difference voltages both in the case where the excitation winding 111 operates normally and in the case where part of the excitation winding 111 is suffered from short-circuiting, with respect to one embodiment of the resolver in accordance with the present invention.

FIG. 8 shows a graph obtained based on the data in FIG. 12, where the horizontal axis represents the rotation angles of the rotor and the vertical axis represents the difference voltages. It can be clearly understood from FIG. 8 that when the excitation winding is suffered from short-circuiting, a stable output can be obtained irrespective of the rotation angles. In particular, unlike in the conventional art, a fault can be detected irrespective of the rotation angle of the rotor.

Figure 9:
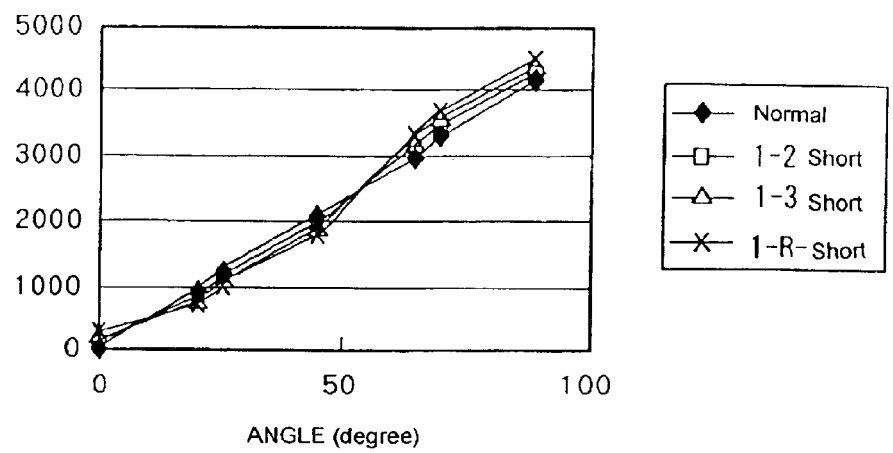
FIG. 9 is a graph showing the linearity of the resolver in accordance with the present invention both in the case where the excitation winding 111 operates normally and in the case where part of the excitation winding 111 is suffered from short-circuiting, with respect to one embodiment of the resolver in accordance with the present invention.
Figure 10:
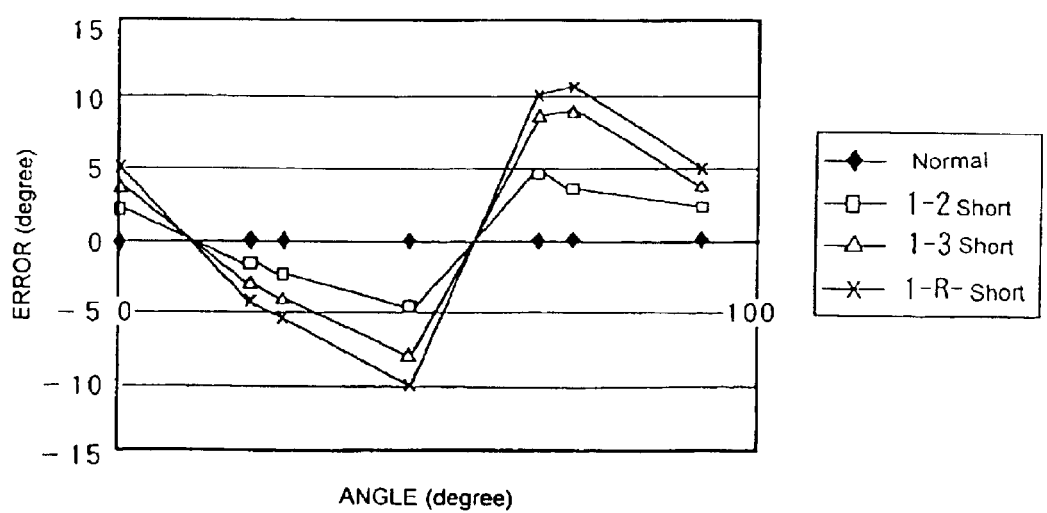
FIG. 10 is a graph showing only error components in the linear output shown in FIG. 9.

FIGS. 9 and 10 show the data similar to those in FIGS. 6 and 7, but for the excitation winding rather than the output winding in FIGS. 6 and 7. Thus, the descriptions thereof will be omitted here.

Then, an embodiment in which the resolver in accordance with the present invention is applied to a power steering apparatus or the like in automobile will be described.

The resolver in accordance with the present invention has an advantage in which a fault thereof can be easily detected as set forth above. Thus, the resolver of the present invention is applicable to various apparatus in automobile employing a motor, e.g., a power steering apparatus, an engine control, a fuel valve control, as well as to other equipment or machining apparatus employing a servomotor.

In general, a power steering apparatus is configured to be in the form of a servomechanism provided in midway of a manual steering mechanism. A manually-provided displacement is supplied to the servomechanism as its input signal, and an output mechanism exhibits movement which follows the input signal. Most of the power steering apparatuses is currently driven by oil pressure. However, as electric vehicles have been put in practical use in view of adverse effects of using gasoline for cars, a motor-driven power steering apparatus has become desired.

Figure 13:
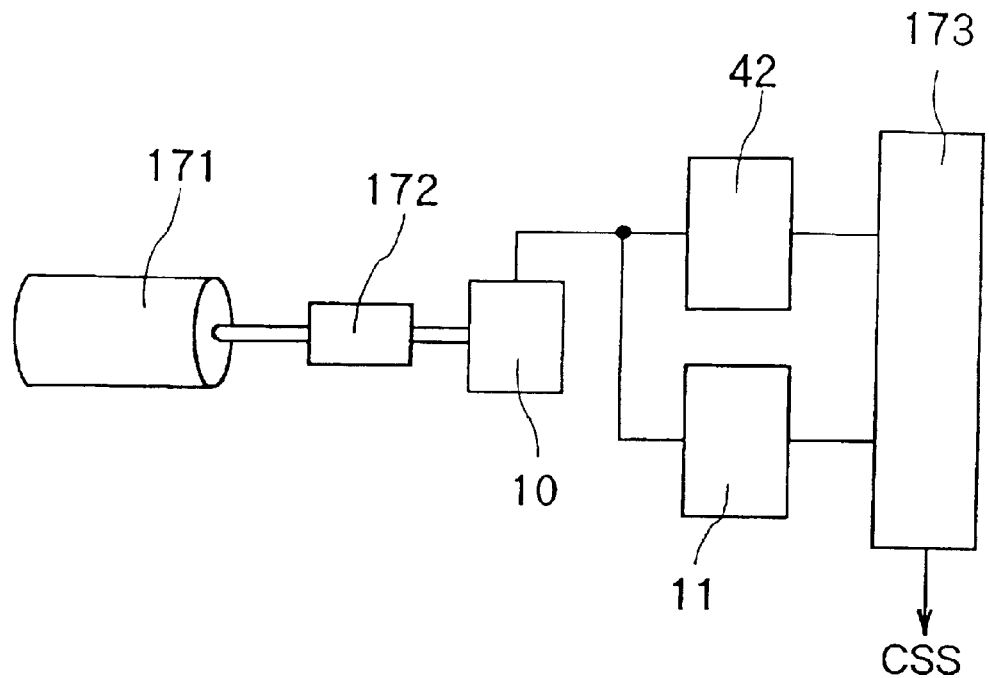
FIG. 13(a) shows the block diagram of a control section for digital control in the case where the resolver in accordance with the present invention is used for detecting a rotation angle, a position or the like of a motor.
FIG. 13(b) shows the block diagram of a control section for analog control in the case where the resolver in accordance with the present invention is used for detecting a rotation angle, a position or the like of a motor.
Figure 13:
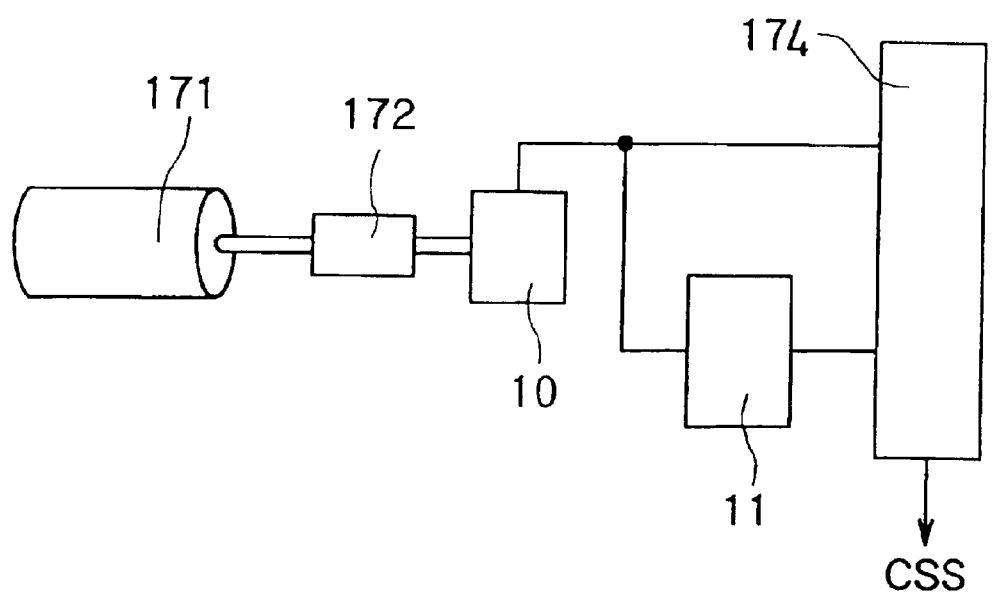
Figure 14:
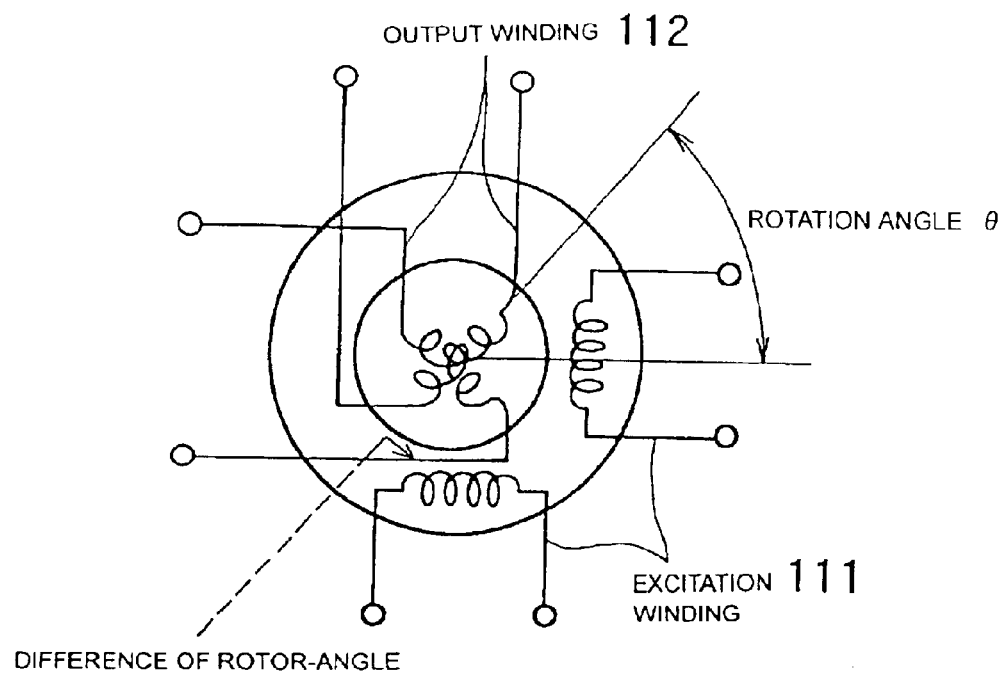
FIG. 14 is a diagram for illustrating the principle configuration of a conventional resolver.
Figure 14:
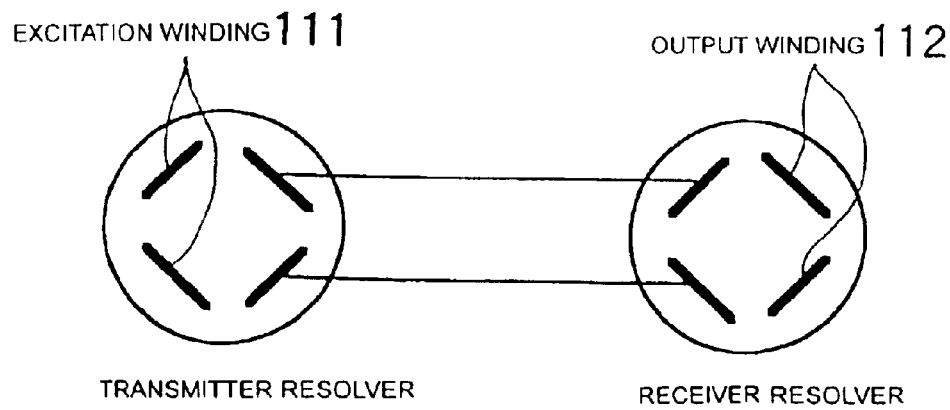
Figure 15:
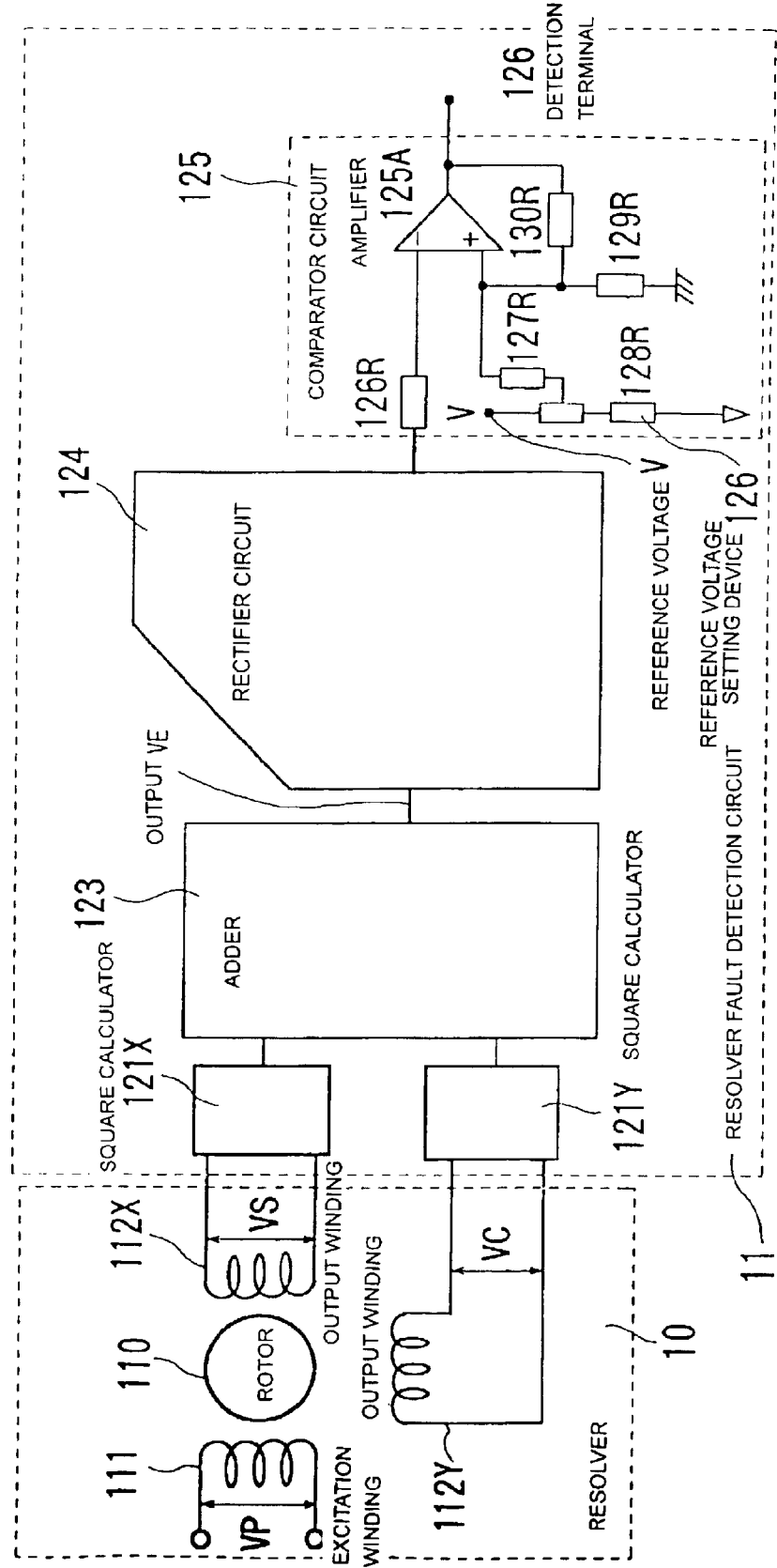
FIG. 15 is a diagram for illustrating the configuration of the conventional resolver and a fault detection circuit utilizing the same.

However, no safe apparatus capable of detecting a rotation angle of a motor is available, thereby presenting difficulty in putting the motor-driven power steering apparatus in practical use. FIGS. 13(a) and 13(b) show a motor-driven power steering apparatus which can overcome such a difficulty. The detail descriptions of the power steering apparatus itself are omitted here, and part thereof which relates to the present invention, i.e., a control section in which the resolver in accordance with the present invention is used in servomechanism, will be described below.

FIGS. 13(a) and 13(b) each show the block diagram of a control section in the case where the resolver in accordance with the present invention is used for detecting a rotation angle, a position or the like of a motor. More specifically, FIG. 13(a) shows the diagram for digital control, while FIG. 13(b) shows the diagram for analog control. In FIG. 13(a), a motor 171 is coupled to a rotor of a resolver 10 via a joint 172. A rotation angle of the resolver 10 is converted into a digital signal by a resolver digital circuit 42, and simultaneously, fault detection is performed by a resolver fault detection circuit 11. The resolver digital circuit 42 and the resolver fault detection circuit 11 are connected to a digital control circuit 173 that is composed of various components such as a microprocessor. The digital control circuit 173 outputs a signal CSS in accordance with an output of the resolver digital circuit 42 when an output from the resolver fault detection circuit 11 indicates the normal operation being maintained, and controls the motor 171.

When the output from the resolver fault detection circuit 11 indicates the operation being out of the normal condition, the digital control circuit 173 operates so that the power steering mechanism is released.

In FIG. 13(b), the output of the resolver 10 is directly supplied to an analog control circuit 174, and the operating process to be performed by the resolver digital circuit 42 in FIG. 13(a) is performed instead within the analog control circuit 174. The operations to be performed in the configuration in FIG. 13(b) is identical with that of the configuration in FIG. 13(a).

As described above, in accordance with the present invention, an output terminal is provided at the middle point between the opposite end terminals of the output winding of the resolver. Thus, a difference voltage between a first output voltage, between one of the end terminals and the middle point of the output winding of the resolver, and a second output terminal, between the other end terminal and the middle point of the output winding, can be obtained for the purpose of detecting a fault such as short-circuiting between the windings or the like. By employing this difference voltage between the first output voltage, between one of the end terminals and the middle point of the output winding of the resolver, and the second output terminal, between the other end terminal and the middle point of the output winding, a fault can be always detected irrespective of a specific rotation angle of the rotor, even in the case where an accident caused by short-circuiting in the excitation winding or the output winding occurs.

Furthermore, unlike in the conventional art in which a difference between an amplitude in a normal operation and an amplitude in a faulty operation is detected thereby resulting in making it difficult to set a large signal-to-noise ratio, no output appears in principle with no fault in accordance with the present invention. In other words, an output appears only when a fault has occurred, and therefore, a large signal-to-noise ratio can be realized.

In addition, a fault in the output winding 112X for outputting the X direction component of the rotor of the resolver and a fault in the output winding 112Y for outputting the Y direction component of the rotor of the resolver can be separately detected in accordance with the present invention, effective data necessary for analyzing the accident can be obtained.

When the resolver of the present invention is used in a power steering device for automobiles or the like, a fault can easily be detected, and therefore the safety of automobiles can be improved.

What is claimed is:

1. A resolver comprising:
   a rotor;
   a stator;
   an excitation winding;
   a first output winding for outputting an X direction component of the rotor; and
   a second output winding for outputting a Y direction component of the rotor, wherein an output terminal is provided at a middle point between opposite end terminals of each of the output windings.

2. The resolver of claim 1, wherein the excitation winding and the output winding being wound around an identical pole of the stator.

3. The resolver of claim 1, further comprising a resolver fault detection circuit, wherein the resolver fault detection circuit comprises:

a difference voltage detection circuit for obtaining a difference voltage between a first output voltage, between one of the opposite end terminals of the first or second output winding of the resolver and the middle point, and a second output voltage, between the other one of the opposite end terminals of the output winding and the middle point; and a comparator circuit for outputting a signal as a fault signal when an output voltage from the difference voltage detection circuit deviates from a reference value.

4. A resolver comprising:

a rotor:

a stator:

an excitation winding;

a first output winding for outputting an X direction component of the rotor; and a second output winding for outputting a Y direction component of the rotor, the excitation winding and the first or second output winding being wound around an identical pole of the stator, wherein an output terminal is provided at a middle point between opposite end terminals of each of the output windings.

5. A resolver fault detection circuit to be used for a resolver, comprising:

a rotor;

a stator;

an excitation winding;

a first output winding for outputting an X direction component of the rotor; and a second output winding for outputting a Y direction component of the rotor, wherein the circuit comprises;

an output terminal provided at a middle point between opposite end terminals of each of the output windings;

a difference voltage detection circuit for obtaining a difference voltage between a first output voltage, between one of the opposite end terminals of the first or second output winding of the resolver and the middle point, and a second output voltage, between the other one of the opposite end terminals of the output winding and the middle point; and a comparator circuit for outputting a signal as a fault signal when an output voltage from the difference voltage detection circuit deviates from a reference value.

* * * * *